(12) United States Patent
Cusin et al.

(10) Patent No.: US 8,636,050 B2
(45) Date of Patent: Jan. 28, 2014

(54) COMPLEX PIERCED MICROMECHANICAL PART

(75) Inventors: Pierre Cusin, Villars-Burquin (CH); David Richard, Yverdon-les-Bains (CH); Philippe Dubois, Marin (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 13/365,041

(22) Filed: Feb. 2, 2012

(65) Prior Publication Data

US 2012/0199996 A1 Aug. 9, 2012

(30) Foreign Application Priority Data

Feb. 3, 2011 (EP) .................................. 11153244

(51) Int. Cl.
*B22C 7/00* (2006.01)
*B22D 19/00* (2006.01)
*B22D 23/00* (2006.01)

(52) U.S. Cl.
USPC ................................. 164/45; 164/46; 164/91

(58) Field of Classification Search
USPC ......................................... 164/44, 45, 46, 91
See application file for complete search history.

(56) References Cited

U.S. PATENT DOCUMENTS

| | | | | |
|---|---|---|---|---|
| 5,679,436 A | * | 10/1997 | Zhao ............................. | 428/141 |
| 6,015,599 A | * | 1/2000 | Keller et al. ................. | 428/34.4 |
| 8,193,076 B2 | * | 6/2012 | Moslehi et al. ............... | 438/479 |
| 8,278,192 B2 | * | 10/2012 | Wang et al. .................... | 438/462 |
| 2003/0111759 A1 | | 6/2003 | Wood et al. | |

FOREIGN PATENT DOCUMENTS

EP 2 236 455 A1 10/2010

OTHER PUBLICATIONS

Bongrain, Alexandre, et al., "Selective nucleation in silicon moulds for diamond MEMS fabrication", Journal of Micromechanics & Microengineering, Jul. 1, 2009, pp. 1-7, vol. 19, No. 7, XP 020160890, Institute of Physics Publishing, Bristol, GB, ISSN: 0960-1317.
European Search Report of EP 11 15 3211, dated Jun. 21, 2011.
Karczemska, Anna, et al., "Diamond Microfluidic Devices manufactured with the replica method", Perspective Technologies and Methods in Mems Design, Apr. 22, 2009, pp. 17-19, XP 031471595, MEMSTECH 2009, 2009 5th International Conference, IEEE, Piscataway, NJ, USA, ISBN: 978-966-2191-06-6.
International Search Report issued in related application PCT/EP2012/050127, completed on Feb. 9, 2012 and mailed Feb. 17, 2012.
Prasad S V et al: "Application of Diamond-Like Nanocomposite Tribological Coatings on LIGA Microsystem Parts", Journal of Microelectromechanical Systems, IEEE Service Center, Piscataway, NJ, US, vol. 18, No. 3, Jun. 1, 2009, pp. 695-704, XPOI1254803, I SSN: 1057-7157 figure 4 p. 696.

* cited by examiner

*Primary Examiner* — Kevin P Kerns
(74) *Attorney, Agent, or Firm* — Griffin & Szipl, P.C.

(57) ABSTRACT

The invention relates to a method of fabricating a micromechanical part made of a single piece material. According to the invention, the method includes the following steps: a) forming a substrate which includes the negative cavity for said micromechanical part to be fabricated; b) forming a sacrificial layer on one portion of the substrate; c) depositing particles on the substrate intended to form a germ ination layer; d) removing the sacrificial layer so as to selectively leave one portion of the substrate free of any particles; e) depositing a layer of material by chemical vapour phase deposition so that the material is exclusively deposited where the particles remain; f) removing the substrate to release the micromechanical part formed in said negative cavity.

10 Claims, 5 Drawing Sheets

COMPLEX PIERCED MICROMECHANICAL PART

This application claims priority from European Patent Application No. 11153244.6 filed Feb. 3, 2011, the entire disclosure of which is incorporated herein by reference.

FIELD OF THE INVENTION

The invention relates to a complex micromechanical part made from any material, such as, for example, a carbon-based material, and a method of fabricating a part of this kind.

BACKGROUND OF THE INVENTION

Fabrication of a micromechanical part purely from synthetic diamond or DLC (diamond like carbon) is very expensive and is not tribologically advantageous due to the unfavourable roughness generated by the thick layer deposition process or by a solid etching method. Consequently, it is currently preferred to coat the micromechanical part using a thin layer of synthetic diamond or DLC, although this does enable obtain all shapes to be obtained, particularly if one portion of the part has to be pierced with a hole.

SUMMARY OF THE INVENTION

It is an object of this invention to overcome all or part of the aforecited drawbacks by proposing a method of fabricating a micromechanical part having a complex geometry with pierced holes, which uses a minimum quantity of material and steps and can provide parts with greatly improved roughness and a very favourable scrap rate and production cost.

The invention therefore relates to a method for fabricating a micromechanical part in a single piece material, characterized in that it includes the following steps:
 a) Forming a substrate which includes the negative cavity for said micromechanical part to be fabricated;
 b) Forming a sacrificial layer on one portion of the substrate;
 c) Depositing particles on the substrate intended to form germination points;
 d) Removing the sacrificial layer so as to selectively leave one portion of the substrate free of any particles;
 e) Depositing a layer of material by chemical vapour phase deposition exclusively where particles remain;
 f) Removing the substrate to release the micromechanical part formed in said negative cavity.

It is thus clear that the method allows the fabrication of a single piece micromechanical part, i.e. with no discontinuity of material, which has a "skin" of material, i.e. a small amount of material, the external surface of which takes up the very favourable roughness of the substrate. This very considerably decreases the cost of the material required on the external layer and improves the overall roughness, especially on the external surface, and improves the tribology thereof. Moreover, the material is selectively deposited by depositing only the quantity of material necessary for the final coating, with no requirement for any subsequent alteration steps.

In accordance with other advantageous features of the invention:
 Prior to step f), the method includes step g): removing from the substrate a greater thickness than that of the deposited layer, in order to leave a limited thickness of said layer of material in said negative cavity;
 Step b) is performed by photolithography;
 Step c) includes phase 1): coating the substrate with a colloidal solution including said particles, and phase 2): removing the solvent from the colloidal solution, so that only the particles remain on the substrate;
 The particles are of the same nature as the material deposited in step e);
 The material deposited in step e) is formed from a silicon based compound or partly from a carbon allotrope;
 After step e), the method includes step h): filling the mould, coated with the material deposited in step e), with a second material so as to obtain a micromechanical part made of a first material which is reinforced and/or decorated with a second material;
 In step h), the second material is formed projecting from said cavity so as to form an additional functional element of the micromechanical part;
 The second material includes a metal or metal alloy.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

The invention relates to a method of fabricating a single piece micromechanical part, for example made of a carbon based material. "Carbon based" means a synthetic carbon allotrope in crystalline form, such as diamond or one or several layers of graphene, or in amorphous form, such as DLC.

Of course, advantageously according to the invention, other types of materials, which can be deposited in layers and which have a tribological advantage, may be used as an alternative to a synthetic carbon allotrope. This alternative material may be, for example, a silicon based compound, i.e. for example silicon nitride, silicon oxide or silicon carbide.

This micromechanical part was devised for applications within the field of horology. However, other domains may very well be envisaged, such as, in particular, aeronautics, jewellery or the automobile industry.

Within the field of horology, this micromechanical part may, for example, form part of the exterior of the watch, the balance spring, balance, pallets, bridges or even the wheel sets, such as the escape wheels, completely or partially from a base of synthetic carbon allotrope or an alternative material as explained hereinbefore.

A first embodiment of the method of fabricating this micromechanical part is presented in FIGS. 1 to 8. In step a), the method consists in forming, in a substrate 1, a negative cavity 3 for the future micromechanical part. A large variety of substrates 1 is possible. Preferably, the material of substrate 1 is selected for its low roughness, i.e. the natural feature of having a smooth surface, but also for its resistance to the aggressiveness of the deposition steps.

Figure 1:
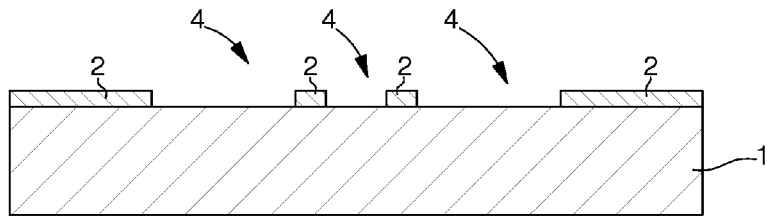
FIGS. 1 to 8 are diagrams of successive steps of the fabrication method according to a first embodiment of the invention.
Figure 2:
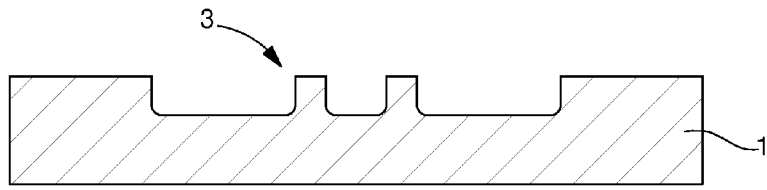

By way of example, FIGS. 1 and 2 show step a formed from a silicon substrate 1 for which it is possible to obtain very good roughness, i.e. an arithmetic mean value Ra of substantially less than 10 nm.

Thus, in a first phase illustrated in FIG. 1, substrate 1 is coated with a mask 2 having holes 4 which leave a top portion of substrate 1 exposed. In a second phase, etching is performed in holes 4. This etching may be wet or dry etching. Finally, in a third phase illustrated in FIG. 2, the mask 2 is removed, leaving only the negative cavity 3 made in substrate 1.

Figure 3:
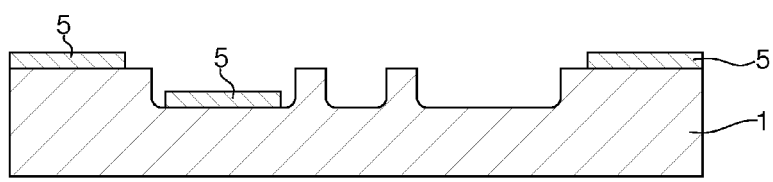

In a second step b illustrated in FIG. 3, substrate 1 is coated with a sacrificial layer 5 which leaves areas of substrate 1 exposed. Preferably, step b is performed by photolithography using a positive or negative photosensitive resin.

Figure 4:
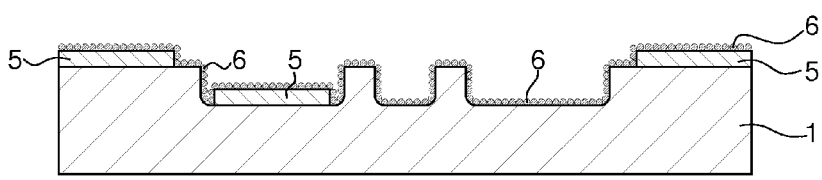

As illustrated in FIG. 4, a third step c consists in coating the whole of substrate 1 with particles 6 intended to form germination points for the subsequent deposition.

Preferably, step c includes a first phase of coating substrate 1 using a colloidal solution containing said particles. The coating can thus be obtained by at least partially immersing substrate 1 in a solution in which the particles are purposely made to move in the solvent so as to obtain the most homogeneous possible distribution in the solution. By way of example, the mobility of the particles in the solvent may be achieved by ultrasonic agitation. Finally, the solvent may consist of alcohol or water, although it is not limited thereto.

Particles 6 are used as germination points. In this regard, the particles may be impurities with respect to the material of the subsequent deposition, or they may be of the same nature as the material of the subsequent deposition. Preferably, the diameter of the particles is comprised between several nanometers and several tens of nanometers.

Step c continues with a second phase intended to remove the solvent from the solution to form particles 6 on substrate 1. This second phase may be obtained, for example, by vaporising the solvent.

Figure 5:
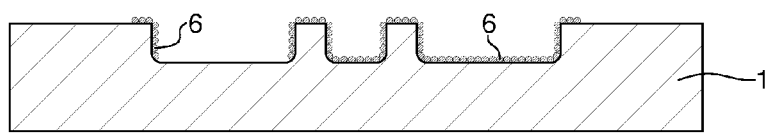

In a fourth step d illustrated in FIG. 5, the method consists in removing sacrificial layer 5 from substrate 1 so as to rid one portion of substrate 1 of any particles 6. It is thus clear that the portions featuring particles 6 are the areas where there is no sacrificial layer 5. Step d may, by way of non-limiting example, be obtained by dissolving or by selective chemical etching of sacrificial layer 5.

Figure 6:
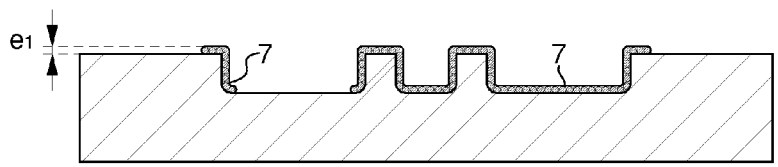

In a fifth step e of the first embodiment, the method consists in depositing a material 7 by chemical vapour phase deposition so that particles 6 are exclusively deposited or remain. At the end of step e, as illustrated in FIG. 6, there is obtained a substrate 1, directly formed with the desired partial layer of material 7.

Figure 7:
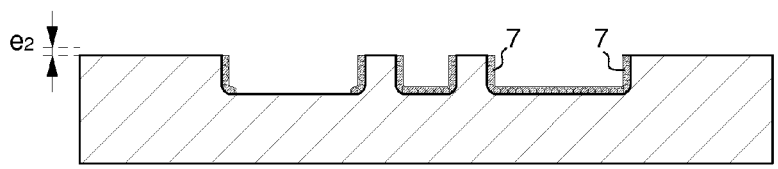

The method according to the invention may include an optional sixth step g. Step g is for removing one portion of the substrate 1 coated with layer 7, in order to leave a limited thickness of said layer 7 in said negative cavity 3. Preferably according to the invention, a larger thickness $e_2$ than thickness $e_1$ of layer 7 is removed from substrate 1, as illustrated in FIG. 7. It is thus clear that layer 7 is definitely no longer present except in cavity 3 of substrate 1.

In a last step f of the first embodiment, the method consists in removing substrate 1 so as to release the micromechanical part formed at least partially in cavity 3. Consequently, in the above example in which substrate 1 is made of silicon, step f may consist of selective etching of the silicon. This may, for example, be obtained by chemical etching using a bath comprising tetramethylammonium hydroxide (TMAH and TMAOH).

Figure 8:
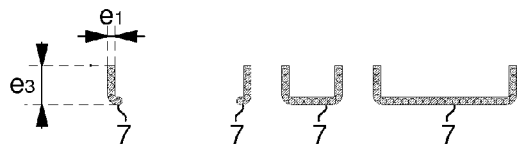

At the end of step f, as illustrated in FIG. 8, there is obtained a micromechanical part, formed exclusively by layer 7, the geometry of which at least partially matches cavity 3. Advantageously, the external surface, i.e. the surface which was directly in contact with substrate 1, has very good roughness, i.e. comparable to that of substrate 1, and is preferably used as the mechanical contact surface.

Finally, for a height $e_3$ of the micromechanical part comprised between 10 μm and 500 μm, a thickness $e_1$ of layer 7 comprised between only 0.2 μm and 20 μm is deposited. The savings in material costs and production costs due to this shortened deposition time in step e are thus immediately clear.

Therefore, regardless of the complexity of the micromechanical part, the method does not become more difficult to implement. By way of example, there is no increased difficulty in forming a toothing on a wall of cavity 3, which will form a matching toothing on the micromechanical part.

Figure 9:
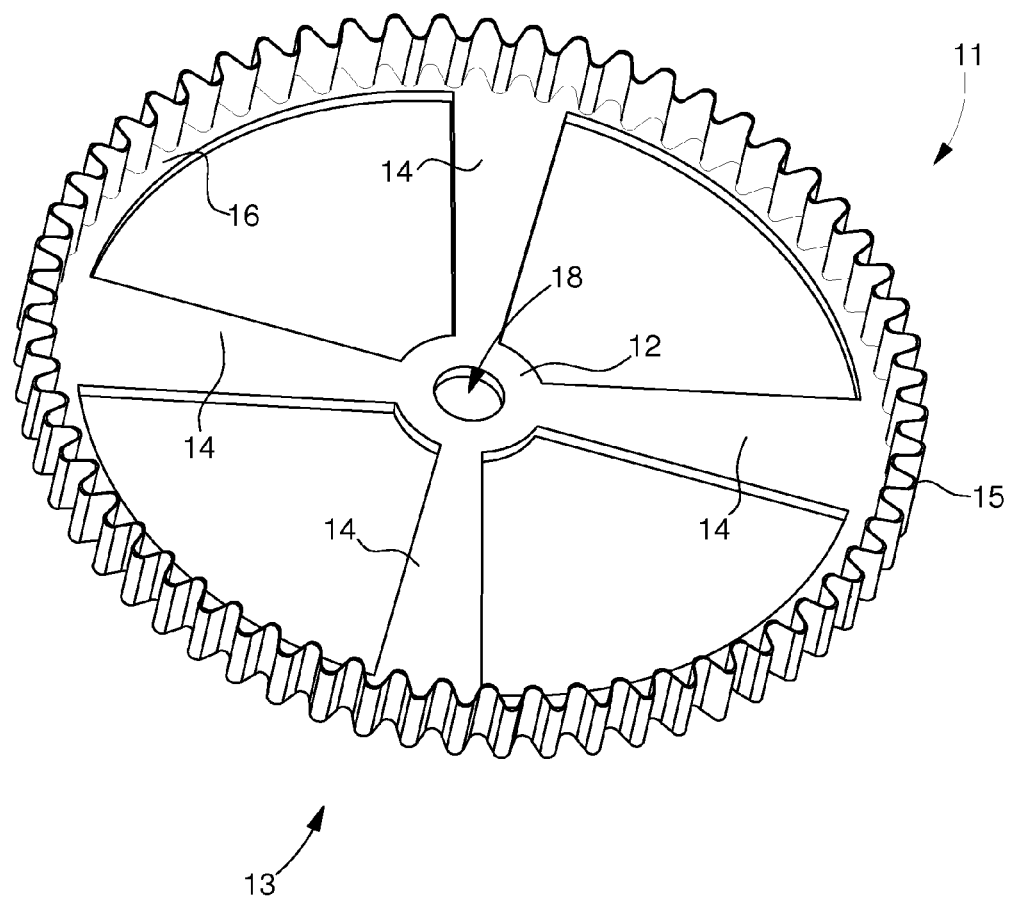
FIG. 9 is a diagram of an example micromechanical part obtained according to a first embodiment of the invention.

By way of non-limiting example, a micromechanical part 11, which can be obtained according to the first embodiment, is shown in FIG. 9. Micromechanical part 11 includes a substantially discoid plate 13 with a hole 18 at the centre thereof allowing cooperation, for example, with a pivot pin. Moreover, coaxial to hole 18, there extends a hub 12 connecting several arms 14 to the felloe 16. A toothing 15 projects orthogonally from the periphery of the felloe. FIG. 9 thus shows that the thickness of toothing 15 and plate 13 is formed by the thickness $e_1$ of layer 7 deposited in step e of the method.

Advantageously, the material is selectively deposited by depositing only the quantity of material necessary for the final coating, with no requirement for any subsequent alteration steps. This results in a reduction in the scrap rate caused by the operation of removing material (damage to substrate 1, slivers on deposition 7, etc.). This also reduces production costs, due to the shortening of step e of deposition 7, the use of a reduced quantity of material 7 and the absence of any mechanical removal operation.

A second alternative embodiment to the first embodiment is shown in FIGS. 10 to 14. Step a according to the second embodiment is identical to the first embodiment and consists in forming, in a substrate 21, a negative cavity 23 for the future micromechanical part, with the same variants and advantages as the first embodiment.

Figure 10:
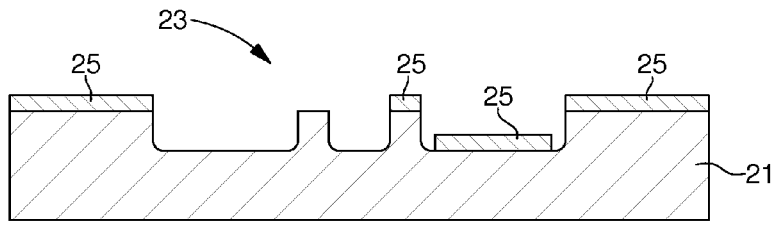
FIGS. 10 to 14 are diagrams of successive steps of a fabrication method according to a second embodiment of the invention.

In a second step b illustrated in FIG. 10, substrate 21 is coated with a sacrificial layer 25 which leaves areas of substrate 21 exposed. Preferably, step b is performed by photolithography using a positive or negative photosensitive resin.

Figure 11:
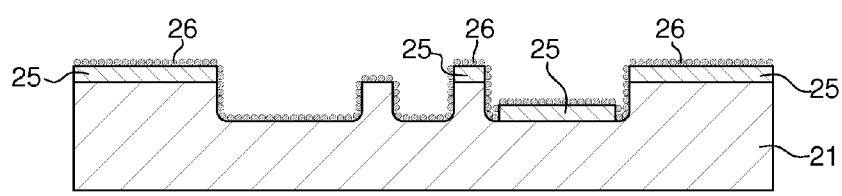

As illustrated in FIG. 11, a third step c consists in coating the whole of substrate 21 with particles 26, intended to form germination points for the subsequent deposition, with the same variants and advantages as step c) of the first embodiment.

Figure 12:
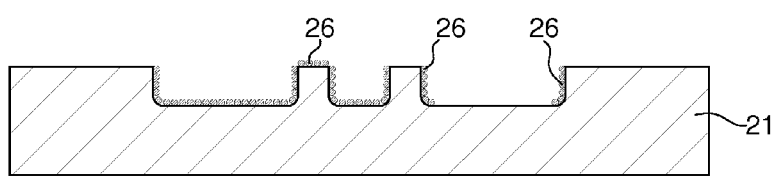

In a fourth step d illustrated in FIG. 12, the method consists in removing sacrificial layer 25 from substrate 21 so as to rid one portion of substrate 21 of any particles 26. It is thus clear that the portions featuring particles 26 are the areas where there is no sacrificial layer 25. Step d may, by way of non-limiting example, be obtained by dissolving or by selective chemical etching of sacrificial layer 25.

Figure 13:
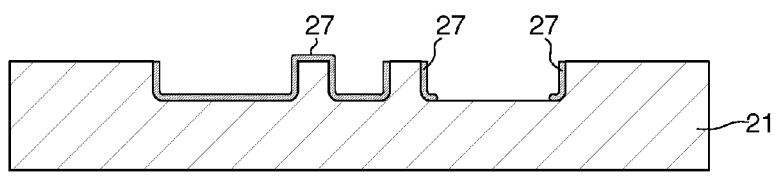

In a fifth step e of the second embodiment, the method consists in depositing a material 27 by chemical vapour phase deposition so that particles 26 are exclusively deposited or remain. At the end of step e), as illustrated in FIG. 13, there is obtained a substrate 21, directly formed with the desired partial layer of material 27.

The method according to the second embodiment of the invention may also include an optional sixth step g, which is identical to that of the first embodiment, but has not been illustrated.

In a last step f of the second embodiment, the method consists in removing substrate 21, so as to release the micromechanical part formed in cavity 23, with the same variants and advantages as in the first embodiment.

Figure 14:
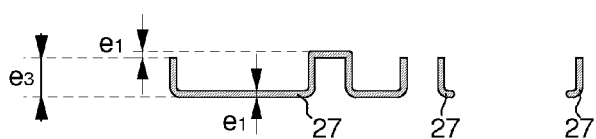

At the end of step f, as illustrated in FIG. 14, there is obtained a micromechanical part, formed exclusively by layer 27, the geometry of which at least partially matches cavity 23. Advantageously, when optional step g is not performed, a thickness $e_1$ of layer 27 may be added to the height $e_3$ of the micromechanical part of the first embodiment, for the total height illustrated in FIG. 14.

Moreover, it is also clear that, with the second embodiment, step g is not necessary for limiting layer 27 in cavity 23. Indeed, the same result can be obtained simply by forming a sacrificial layer 25 over the entire substrate 21, with the exception of cavity 23.

Thus, as in the first embodiment, regardless of the complexity of the micromechanical part, the method does not become more difficult to implement. By way of example, there is no increased difficulty in forming a toothing on a wall of cavity 23, which will form a matching toothing on the micromechanical part. Hence, it is clear that micromechanical part 11 of FIG. 9 can also be fabricated using the second embodiment.

Consequently, in the second embodiment, as in the first, there is obtained a micromechanical part formed exclusively by layer 27, whose geometry matches at least one part of cavity 23. Advantageously, the external surface, i.e. the surface which was directly in contact with substrate 21, has very good roughness, i.e. comparable to that of substrate 21, and is preferably used as the mechanical contact surface.

Moreover, advantageously in the second embodiment, the material is selectively deposited by depositing only the quantity of material necessary for the final coating, with no requirement for any subsequent alteration steps. This results in a reduction in the scrap rate caused by the operation of removing material (damage to substrate 21, slivers on deposition 27, etc.). This also reduces production costs, due to the shortening of deposition step e), the use of a reduced quantity of material 27 and the absence of any mechanical removal operation.

Figure 15:
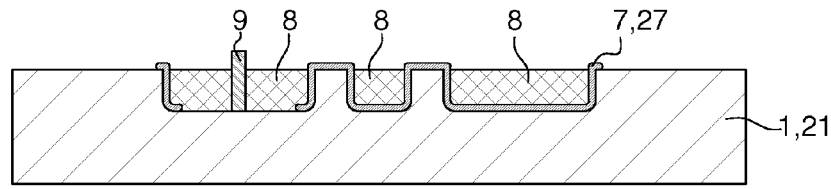
FIGS. 15 to 17 are diagrams of successive steps of a fabrication method according to a third embodiment of the invention.
Figure 16:
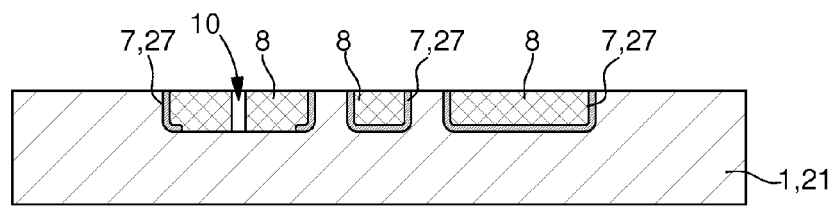
Figure 17:
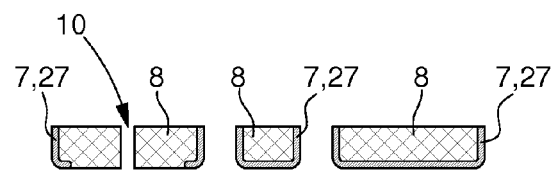

A third embodiment forming an alternative to the first and second embodiments explained hereinbefore is shown in FIGS. 15 to 17. Steps a to e) remain identical respectively to the first and second embodiments. However, as illustrated in FIG. 15, a step h is performed after step e, which consists in filling the hollow of cavity 3, 23, coated with the first material 7, 27, with a second material 8.

Thus, where appropriate after optional step g and after step f, which are similar to the first and second embodiments, respectively illustrated in FIGS. 16 and 17, there is obtained a micromechanical part made of a first material 7, 27 with the same variants and advantages as the first two embodiments, wherein the first material 7, 27 is further reinforced by and/or decorated with a second material 8.

According to another advantage of the invention, it is henceforth possible to coat parts with thin layers, which it was not possible to achieve previously because of the particular conditions required for thin layer deposition, such as, for example, the pressure, temperature or compounds used. By way of non-limiting example, and advantageously according to the invention, it is thus possible to form a mainly metallic part from a deposition 8, which is coated with a diamond layer from layer 7, 27, whereas currently, it remains difficult, to the Applicant's knowledge, to coat a metallic part with diamond.

As illustrated in FIG. 15, it is also possible, prior to step h, to form a rod 9, so that a hole 10, free of second material 8, is formed during step h. It can be observed that once rod 9 is removed, the final part is thus pierced right through with a hole 10, as illustrated in FIG. 17. In a non-limiting manner, rod 9 may be formed by photolithography using a negative or positive photosensitive resin.

Preferably, the hollow filling step h is performed by galvanic deposition or hot deformation. The second material is preferably a metal or metal alloy which may or may not be amorphous. However, there is nothing to prevent the type of deposition and/or nature of the deposited material from being changed.

Consequently, in this third embodiment, optional step g) may be used to limit the thickness of said layer 7, 27 in said negative cavity 3, 23, but also to make deposition 8 of the second material flat relative to said limited portion.

Figure 18:
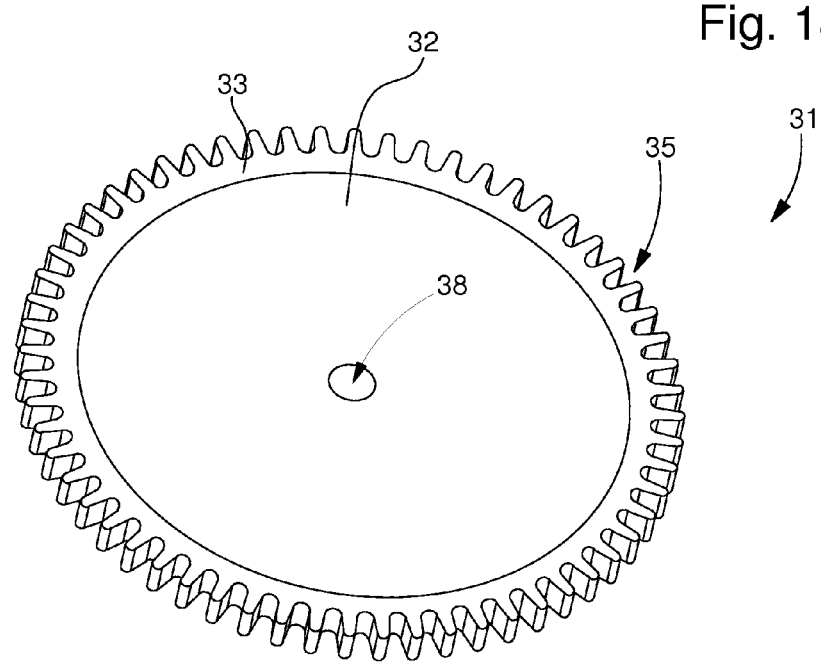
FIG. 18 is a diagram of an example micromechanical part obtained according to a third embodiment of the invention.

It is also clear that it is possible to obtain a micromechanical part with the same complexities as in the first two embodiments. By way of non-limiting example, a micromechanical part 31, which can be obtained according to the first embodiment, is shown in FIG. 18. Micromechanical part 31 includes a substantially annular plate 33 from the periphery of which a toothing 35 projects orthogonally, the rest being filled by portion 32 formed by the step h deposition 8, leaving a hole 38 for cooperation, for example, with a pivot pin. The thickness of toothing 35 is thus formed by the thickness $e_1$ of layer 7, 27 deposited in step e of the method and deposition 8 obtained in step h.

Figure 19:
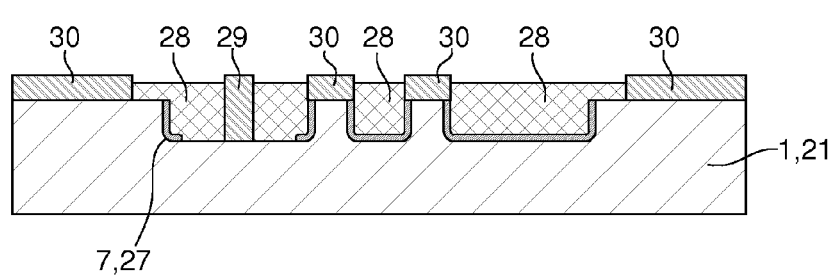
FIGS. 19 to 20 are diagrams of successive steps of a fabrication method according to a fourth embodiment of the invention.
Figure 20:
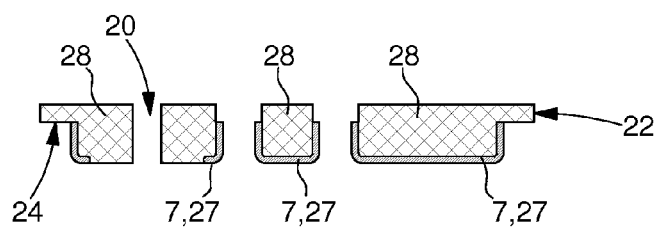

A fourth alternative embodiment to the first and second embodiments explained hereinbefore is shown in FIGS. 19 and 20. Steps a to e remain identical to the first and second embodiments. However, as illustrated in FIG. 19, a sixth step h is performed after step e, which consists in filling the hollows in cavity 3, 23 coated with first material 7, 27, with a second material 28. Thus, after step f, which is similar to the first three embodiments and illustrated in FIG. 20, there is obtained a micromechanical part, which is made of a first material 7, 27, reinforced and/or decorated with a second material 28 and has the same variants and advantages as the first three embodiments.

According to an advantage common to the third embodiment, it is henceforth possible to coat parts with thin layers, which it was not possible to achieve previously because of the particular conditions required for thin layer deposition, such as, for example, the pressure, temperature or compounds used. By way of non-limiting example, and advantageously according to the fourth embodiment of the invention, it is thus possible to form a mainly metallic part from a deposition 28, which is coated with a diamond layer from layer 7, 27, whereas currently, it remains difficult, to the Applicant's knowledge, to coat a metallic part with diamond.

In comparison to step h of the third embodiment, step h according to the fourth embodiment is intended to fill the hollows of cavity 3, 23 and, advantageously, can also form a projecting level of thickness $e_3$ so as to form an additional functional element of the micromechanical part.

Step h of the fourth embodiment preferably includes a phase of structuring a mould 30 on substrate 1, 21 after step e. There is then a phase of filling the recess jointly formed by the hollow of cavity 3, 23 and the holes in mould 30. Finally, step h includes a phase of removing mould 30 from the surface of substrate 1, 21.

The phase of structuring mould 30 may, for example, be formed by photolithography using a negative or positive photosensitive resin. Further, the filling phase may, for example, be performed using galvanoplasty. Galvanoplasty is easier to perform if substrate 1, 21 is made of a conductive material such as strongly doped silicon. The second material is preferably a metal or metal alloy which may or may not be amorphous. However, there is nothing to prevent the type of deposition and/or nature of the deposited material from being changed.

As illustrated in FIG. 19, it is also possible to form a rod 29 at the same time as mould 30 so that a hole 20 free of any second material 28 is formed in step h. It can be observed that once rod 29 is removed, the final part is thus pierced right through with a hole 20, as illustrated in FIG. 20.

Step h may also include a last step of lapping and/or polishing the top portion of deposition 28. Consequently, in a last step f of the fourth embodiment, the method consists in removing substrate 1, 21, so as to release the micromechanical part at least partly formed in cavity 3, with the same variants and advantages as in the first embodiment.

At the end of step f, as illustrated in FIG. 20, there is obtained a micromechanical part, formed by layer 7, 27, the geometry of which at least partially matches cavity 3, 23, wherein layer 7, 27 is reinforced and/or decorated with deposition 28. Advantageously, the external bottom surface is formed by layer 7, 27, i.e. the surface which was directly in contact with substrate 1, 21, has very good roughness, i.e. comparable to that of the substrate 1, 21 and is preferably used as the contact surface.

The micromechanical part also includes a second higher level entirely formed by the deposition 28, i.e. without layer 7, 27, so as to form an additional functional element of the micromechanical part. This functional element may, in a non-limiting manner, be a toothing 22, hole 20 and/or a shoulder 24, intended, for example, to cooperate with another member.

As in the first three embodiments, the savings in material costs and production costs due to the shortened deposition step of layer 7, 27 are immediately clear, with the remainder of the part being formed by a less expensive deposition 28, yet offering a potentially very complex geometry.

Figure 21:
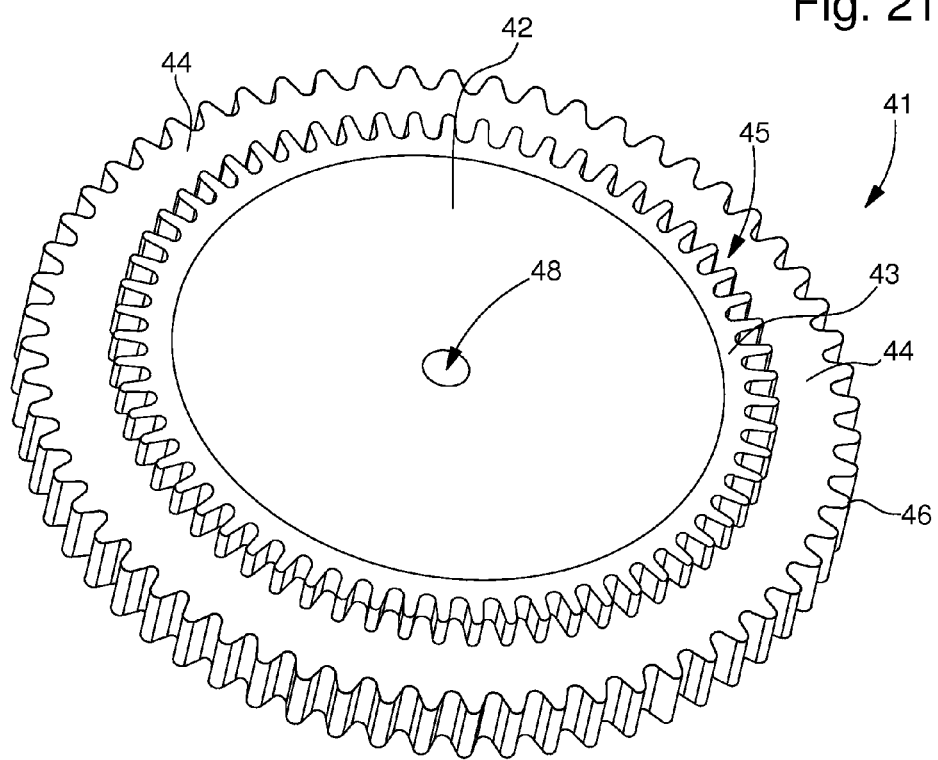
FIG. 21 is a diagram of an example micromechanical part obtained according to a fourth embodiment of the invention.

Consequently, it is clear that a micromechanical part can be obtained with the same complexity as in the first three embodiments. By way of non-limiting example, a micromechanical part 41, which can be obtained according to the fourth embodiment, is shown in FIG. 21. Micromechanical part 41 includes a substantially annular plate 43, comparable to plate 33 of FIG. 18, from the periphery of which a toothing 45 projects orthogonally, the rest being filled by portion 42 formed by the step h deposition 28, leaving a hole 48 for cooperation, for example, with a pivot pin. The thickness of toothing 45 is thus formed by thickness $e_1$ of layer 7, 27 deposited in step e of the method, and deposition 28 obtained in step h. On a second level, formed solely by deposition 28, the micromechanical part 41 includes a wheel 44, the periphery of which includes a toothing 46 and the centre of which has a hole extending hole 48 intended, for example, for cooperation with a pivot pin.

Of course, this invention is not limited to the illustrated example but is capable of various variants and alterations that will appear to those skilled in the art. In particular, several micromechanical parts, which may or may not be of identical design, may be fabricated at the same time on the same substrate. Further, there is nothing to prevent the bottom part of substrate 1, 21 being used.

Consequently, not only may several identical or non-identical cavities 3, 23 be formed on substrate 1, 21, but they may also be formed on several faces of substrate 1, 21, i.e. the steps of the various embodiments of the method can be applied to several faces of substrate 1, 21.

What is claimed is:

1. A method of fabricating a micromechanical part in a single piece material wherein it includes the following steps:
    a) forming a substrate which includes a negative cavity for the micromechanical part to be fabricated;
    b) forming a sacrificial layer on one portion of the substrate;
    c) depositing particles on the substrate intended to form germination points;
    d) removing the sacrificial layer so as to selectively leave one portion of the substrate free of any particles;
    e) depositing a layer of material by chemical vapour phase deposition so that the material is exclusively deposited where the particles remain;
    f) removing the substrate to release the micromechanical part formed in the negative cavity.

2. The method according to claim 1, wherein, before step f), it includes the following step:
    g) removing from the substrate a larger thickness than that of the deposited layer, so as to leave a limited thickness of the layer of material in the negative cavity.

3. The method according to claim 1, wherein step b) is achieved by photolithography.

4. The method according to claim 1, wherein step c) includes the following phases:
    1) coating the substrate using a colloidal solution including a solvent and the particles;
    2) removing the solvent from the colloidal solution to leave only the particles on the substrate.

5. The method according to claim 1, wherein the particles are of the same material as the one of the layer deposited in step e).

6. The method according to claim 1, wherein the material deposited in step e) is formed from a carbon allotrope.

7. The method according to claim 1, wherein the material deposited in step e) is formed from a silicon based compound.

8. A method of fabricating a micromechanical part in a single piece material wherein it includes the following steps:
    a) forming a substrate which includes a negative cavity for the micromechanical part to be fabricated;
    b) forming a sacrificial layer on one portion of the substrate;
    c) depositing particles on the substrate intended to form germination points;
    d) removing the sacrificial layer so as to selectively leave one portion of the substrate free of any particles;
    e) depositing a layer of material by chemical vapour phase deposition so that the material is exclusively deposited where the particles remain;
    f) filling the cavity, coated with the material deposited in step e), with a second material in order to obtain a micromechanical part made of a first material reinforced and/or decorated with a second material; and
    g) removing the substrate to release the micromechanical part formed in the negative cavity.

9. The method according to claim 8, wherein, in step f), the second material is formed projecting from the cavity in order to form an additional functional element of the micromechanical part.

10. The method according to claim 8, wherein the second material includes a metal or metal alloy.

* * * * *